United States Patent [19]
Burrows et al.

[11] Patent Number: 6,028,467
[45] Date of Patent: Feb. 22, 2000

[54] DIFFERENTIAL OUTPUT CIRCUIT

[75] Inventors: David Frank Burrows; Kenneth Stephen Hunt, both of Surrey; Sion Christopher Quinlan, Goring on Thames, all of United Kingdom

[73] Assignee: LSI Logic Corporation, Milpitas, Calif.

[21] Appl. No.: 08/965,128

[22] Filed: Nov. 6, 1997

[30] Foreign Application Priority Data

Nov. 12, 1996 [GB] United Kingdom .................... 9623555

[51] Int. Cl.[7] ........................................................ H03L 5/00
[52] U.S. Cl. ............................ 327/331; 327/65; 327/109; 327/52
[58] Field of Search ...................................... 327/519, 309, 327/315, 317, 318, 321, 322, 324, 327, 328, 331, 65, 109, 52, 53, 54, 55; 330/284

[56] References Cited

U.S. PATENT DOCUMENTS

| | | | |
|---|---|---|---|
| 5,227,681 | 7/1993 | Koyama et al. ........................ 307/494 |
| 5,274,275 | 12/1993 | Colles ...................................... 307/362 |
| 5,396,028 | 3/1995 | Tomassetti ................................ 178/69 |
| 5,525,919 | 6/1996 | Phelan ....................................... 327/52 |
| 5,532,616 | 7/1996 | Keeney ...................................... 326/30 |

*Primary Examiner*—Kenneth B. Wells
*Assistant Examiner*—Hai L. Nguyen

[57] ABSTRACT

A differential output circuit has first and second output lines and an output impedance connected between the first and second lines. The output impedance includes an active device (e.g., a field effect transistor) having a control input for receiving a control signal value for controlling the impedance value of the active device. A bias circuit is responsive to a reference impedance element for generating the control signal value for controlling the impedance value of the active device. An output driver stage is connected to the first and second output lines for supplying first and second differential driven output signals to the first and second output lines, respectively. An integrated circuit can include a number of differential output circuits and a common bias circuit responsive to a single reference impedance element for generating the control signal value for controlling the impedance value of each active device.

10 Claims, 6 Drawing Sheets

DIFFERENTIAL OUTPUT CIRCUIT

BACKGROUND OF THE INVENTION

1. Field of the Invention

The invention relates to differential output driver circuits and to integrated circuits including such output circuits.

2. Description of the Prior Art

A typical differential driver circuit comprises an output driver stage including one or more devices which are driven (alternately) into saturation and produce differential driven outputs on first and second output lines. An impedance is typically connected between the output lines.

FIG. 1 illustrates a prior art output driver circuit 10 which comprises a output driver stage 11 including one or more drive elements which are alternately driven into saturation. The driver stage 11 provides an output signal Y on the first output line 60 by alternatively connecting the output line 60 to a high voltage supply Vdd 16 line and to a low voltage supply line Vss 18 and a complementary driven output $\overline{Y}$ on line 62 by alternately connecting the output line 62 to the low voltage supply line Vss 18 and to the high voltage supply line Vdd 16 out of phase with the connection of the output line 60.

The output lines 60 and 62 are connected via a nominal resistance of 100Ω formed by two separate resistors 26 and 28, each having a nominal resistance of 50Ω. A central tap 24 between the 50Ω resistors 26 and 28 is supplied to the output stage 11 in order to compare the common mode voltage at the center tap 24 to a common mode reference 30 voltage supplied from an BIAS circuit 12. This feedback is used to control the operation of the output drive stage 11 in order to maintain the common mode voltage at point 24 within a desired range. The output driver stage 11 corrects the output common mode voltage by varying two bias currents from the voltage rails Vdd and Vss, respectively, in opposite directions.

Typically, the various components of the output driver circuit 10 will be contained within an integrated circuit. However, it is notoriously difficult to provide resistive elements on chip using large scale integration techniques with reasonable tolerances. Accordingly, for high precision output drivers, conventional practice is to use external discrete resistors between the differential output line pairs 60, 62 in order to be able to provide an output impedance within desired tolerance ranges.

Accordingly, an aim of the invention is substantially to eliminate or at least to mitigate the problems of prior art differential driver circuits.

SUMMARY OF THE INVENTION

In accordance with a first aspect of the invention, there is provided a differential output circuit comprising a first output line, a second output line and an output impedance connected between the first and second lines, where the output impedance comprises an active device including a control input for receiving a control signal value for controlling the impedance value of the active device.

The provision of an active output impedance with a control input for receiving a control signal value enables the output of the output driver circuit to be stabilised. Embodiments of the invention find particular, but not exclusive application in high performance high speed differential output driver circuits. More particularly, but also not exclusively, embodiments of the invention find application in on-chip output driver circuits where fully floating, precision signal impedance levels are required independently of AC operation. Embodiments of the invention provide much improved stabilisation of the DC output impedance without impacting AC performance.

The active device can advantageously be implemented by means of a transistor, preferably by means of a field effect transistor.

Preferably, a bias circuit which is responsive to a reference impedance element generates the control signal value for controlling the impedance value of the active device.

Typically an output driver stage connected to the first and second output lines supplies first and second differential driven output signals to the first and second output lines, respectively. The output driver stage can be connected to receive reference signals levels from the bias circuit.

The invention also provides an integrated circuit including a differential output circuit as set out above.

The integrated circuit can comprise a plurality of differential output circuits and a common bias circuit responsive to a reference impedance element for generating the control signal value for controlling the impedance value of each active device. A respective output driver stage can be connected to each pair of first and second output lines. First and second inputs to the integrated circuit comprising can be provided for connection to an external reference impedance element.

BRIEF DESCRIPTION OF THE DRAWINGS

Exemplary embodiments of the invention will be described hereinafter, by way of example only, with reference to the accompanying drawings in which.

DESCRIPTION OF THE PREFERRED EMBODIMENTS

Figure 1:
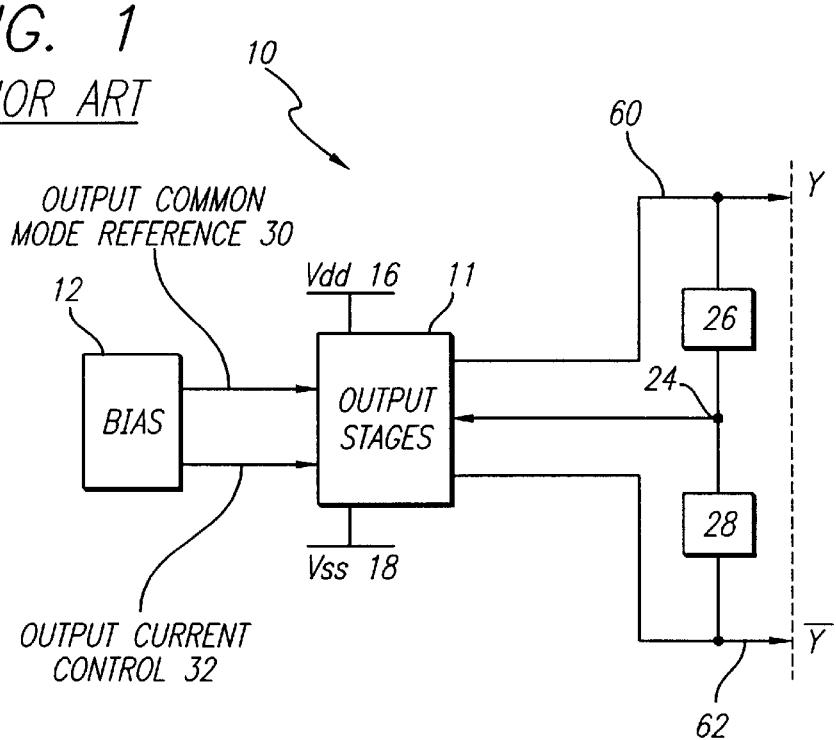
FIG. 1 is a schematic diagram of an output driver circuit for differential output signals including an output impedance formed from two resistors.
Figure 2:
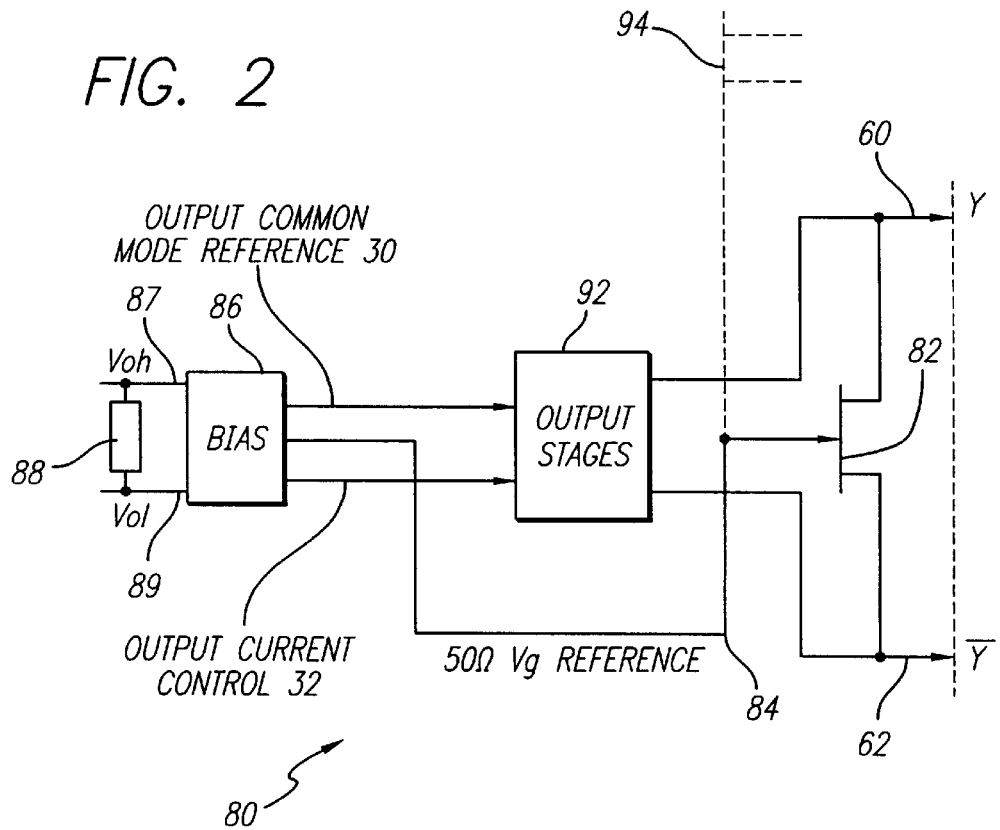
FIG. 2 is a schematic block diagram of a first embodiment of the present invention.

FIG. 2 is a schematic block diagram of a first embodiment 80 of the invention. It will be noted that this embodiment has a similar overall structure to the circuit of FIG. 1. However, in this embodiment of the invention, the resistors 26 and 28 have been replaced by an active impedance element, in this case an FET transistor 82. The source and drain of the transistor 82 are connected between the first and second output lines 60 and 62 of the output driver stage 92. The gate of the transistor 82 is connected to receive an impedance control signal on a control signal line 84 from bias circuitry 86.

The bias circuitry 86 has first and second inputs 87 and 89 across which a reference resistor 88 is connected. The bias circuit 86 is responsive to the impedance value of the reference resistor 88 to determine a control signal for causing the active impedance device 82 to have a predetermined impedance value. The predetermined impedance value has typically the same resistance value as the reference resistor 88, although it could have a value which is a predetermined function of the reference impedance value. The reference impedance 88 is preferably a high precision resistor.

The bias circuitry 86 also supplies an output common mode reference signal 30 and an output current control signal 32 to the driver stage 92.

Although a single output driver stage 92 with its corresponding active output impedance element 82 is shown in FIG. 2, the control signal line 84 from the bias circuitry 86 could be connected to a plurality of output impedance elements 82 for respective pairs of output lines from respective output driver stages, as is represented in FIG. 2 by the dashed lines 94. In such an arrangement only one external reference resistor 88 is required with the output impedance transistor 82 preferably being provided on the integrated circuit. This contrasts with the prior art where a separate external resistor would be provided for each output driver stage.

Figure 3:
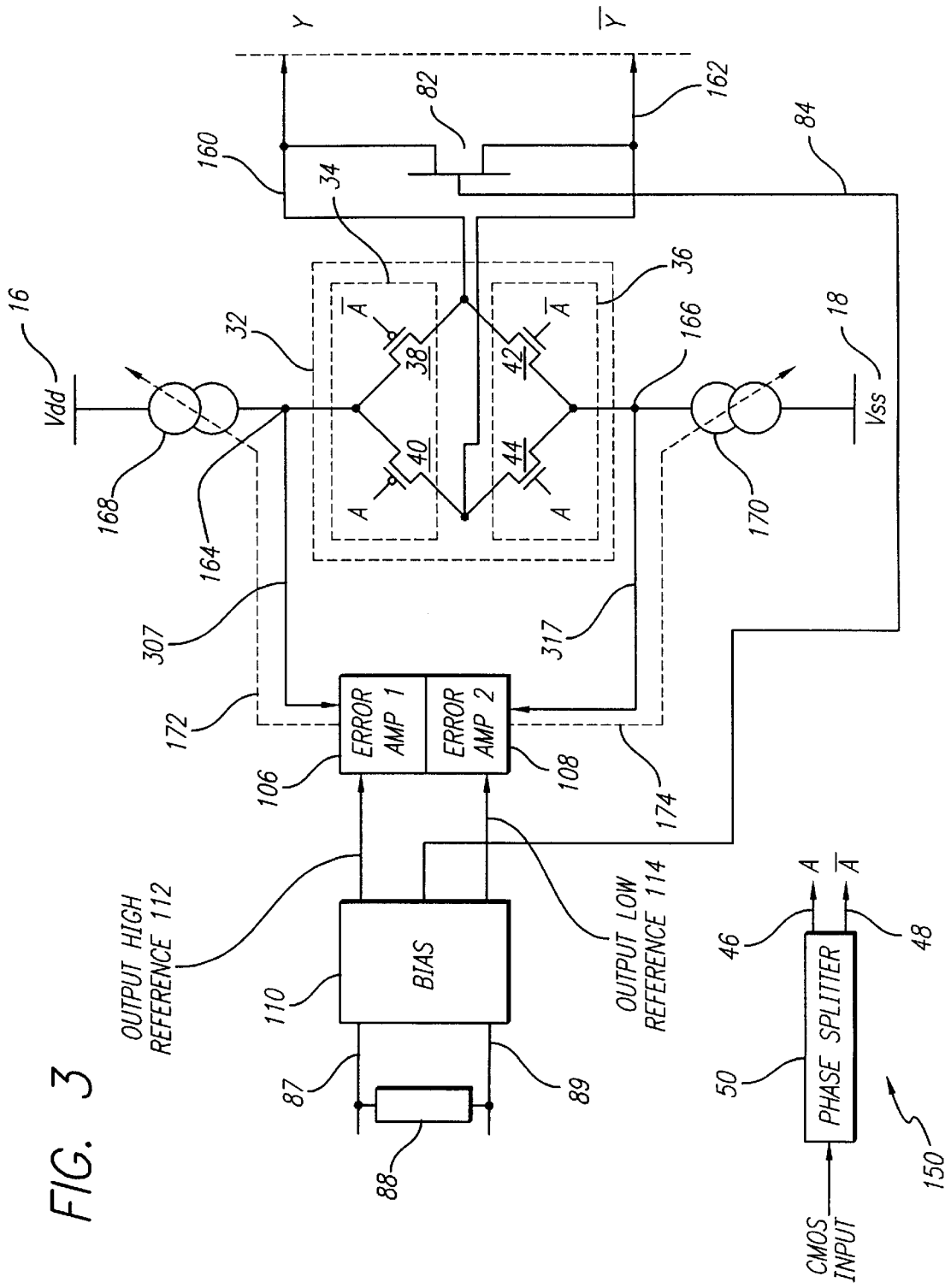
FIG. 3 is a schematic diagram of a second embodiment.

FIG. 3 is a schematic representation of an embodiment 150 of the invention for a preferred type of differential driver stage. In this differential driver stage, a bridge arrangement 32 comprises a first output driver 34 formed by a pair of PMOS output drive devices 38 and 40 and a second output driver 36 formed by a pair of NMOS output drive devices 42 and 44. A first PMOS device 38 is connected between the supply line 16 and a first output line 160. A second PMOS device 40 is connected between the high voltage supply line 16 and a second output line 162. A first NMOS device 42 is connected between the low voltage supply line 18 and the first output line 160 and a second NMOS device 44 is connected between the low voltage supply line 18 and the second output line 162. Signals A and $\overline{A}$ are provided for controlling the PMOS and NMOS devices 38, 40, 42 and 44. Specifically, a phase splitter 50 is provided for splitting a CMOS input into a first signal A 46 and a complementary signal $\overline{A}$ 48.

In a first phase, the signal A to the PMOS device 40 and the NMOS device 44 is high and the signal $\overline{A}$ to the PMOS device 38 and the NMOS device 42 is low. These signals cause low impedance paths from the high voltage supply Vdd to the first output line 160 via PMOS device 38 and from the low voltage supply Vss to the second output line 162 via NMOS transistor 44 to be established.

In a second phase, the signal A to the PMOS device 40 and the NMOS device 44 is low and the signal $\overline{A}$ to the PMOS device 38 and the NMOS device 42 is high. These signals cause low impedance paths from the high voltage supply Vdd to the second output line 162 via PMOS device 40 and from the low voltage supply Vss to the first output line 160 via NMOS transistor 42 to be established.

Accordingly, as a result of the application of the complementary signals A and $\overline{A}$ to the output drive devices of the bridge 32, an output signal Y is supplied on the first output line 160 by alternatively connecting the output line 160 to the high voltage supply line Vdd 16 and to the low voltage supply line Vss 18 and a complementary driven output $\overline{Y}$ is provided on line 162 by alternately connecting the output line 162 to the low voltage supply line Vss 18 and to the high voltage supply line Vdd 16 out of phase with the connection of the output line 160.

The circuit of FIG. 3 provides a control arrangement with separate control of the supply voltages to the output drivers in order to stabilise the DC output voltages and permits the generation of precision output voltages independent of AC operation, power supply noise and electromagnetic interference (EMI).

In FIG. 3, the first output line 160 is connected to a junction between the PMOS transistor 38 and the NMOS transistor 42. A second output line 162 is connected to a junction between the PMOS transistor 40 and the NMOS transistor 44. A junction 164 between the PMOS transistors 38 and 40 is connected to the high voltage supply line 16 via a non-saturated active device 168 (preferably a current source such as an non-saturated active PMOS transistor). A junction 166 between the NMOS transistors 42 and 44 is connected to the low voltage supply line 18 via a non-saturated active device 170 (preferably a current source such as an NMOS transistor).

First and second error amplifiers 106 and 108 are provided. The error amplifier 106 is used to monitor the voltage level at the junction point 164, via a line 307, and to compare this to an output high reference 112 from the bias circuit 110. Similarly, the error amplifier 108 is used to monitor the voltage level at the junction 166 via a line 317, and to compare this to an output low reference 114 from the bias circuit 110.

Any difference between the voltage level at the junction 164 and the output high reference 112 results in a signal 172 which is used to control the non-saturated active device 168 to adjust the voltage level at the junction 164. Similarly, any difference between the voltage level at the junction 166 and the output low reference 114 results in a signal 174 which is used to control the non-saturated active device 170 to adjust the voltage level at the junction 166.

It will be noted, therefore, that the error amplifiers 106 and 108 monitor the junction points 164 and 166 to adjust the supply voltages to the output driver devices with the high and low voltage levels being adjusted independently.

The error amplifiers 106 and 108 do not directly observe the output DC levels of the driven signals Y and $\overline{Y}$, but instead observe an "offset" value, offset by the drain-source voltage (saturation) of the output stage drivers. In the circuit of FIG. 3, this offset is compensated for by adjusting the output high reference 112 and output low reference 114 by near identical values before subtraction by the error amplifier.

In this embodiment, the bias circuitry 110 provides, in addition to the high and low references 112 and 114, an impedance control signal on a control line 84 which is connected to a gate of an active impedance element 82 (in this case an FET transistor). The source and drain of the transistor 82 are connected between the first and second output lines 160 and 162 from the output driver stage 32.

The bias circuitry 110 has first and second inputs 87 and 89 across which a reference resistor 88 is connected. The bias circuit 110 is responsive to the impedance value of the reference resistor to determine a control signal for causing the active impedance device 82 to have a predetermined resistance value. The predetermined impedance value is typically the same value as the reference resistor 88, although it could have a value which is a predetermined function of the reference impedance value. The reference impedance 88 is preferably a high precision resistor.

Figure 4A:
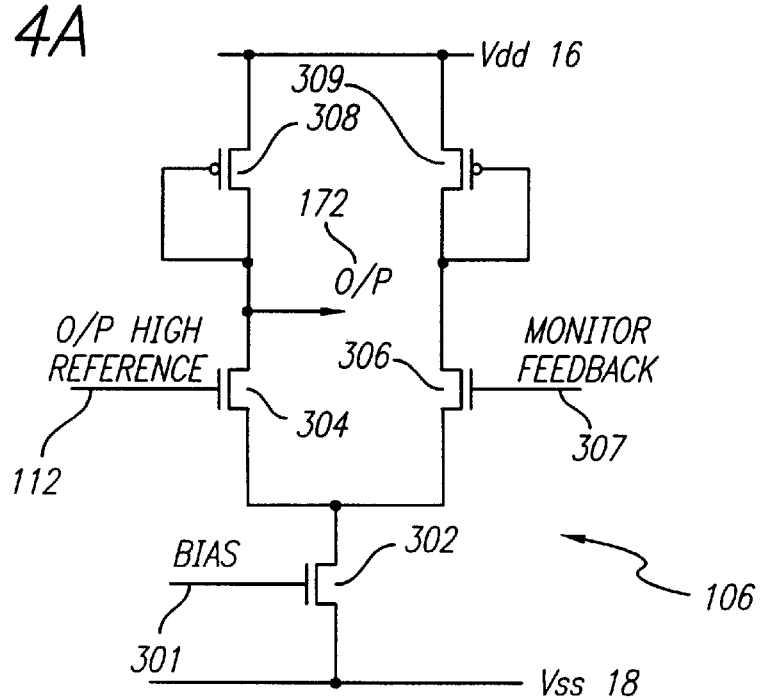
FIGS. 4A and 4B illustrate examples of circuits for implementing error amplifier circuits in the circuit of FIG. 3.

FIG. 4A is an example of an implementation of the first error amplifier 106. The first error amplifier 106 includes first and second P-channel field effect transistors (PMOS transistors) 308 and 309 connected as current sources to the high voltage supply line Vdd 16. The first current source transistor 308 is connected to an NMOS transistor 304, which forms a reference signal input transistor, the gate of which is connected to receive the high reference 112. The junction between the first current source transistor 308 and the reference signal input transistor 304 forms the output control signal line 172. The second current source transistor 309 is connected to an NMOS transistor 306, which forms a monitor signal input transistor, the gate of which is connected to receive the monitor signal 307 (in FIG. 3 fed back from the junction point 164). The reference input transistor 304 and the monitor signal transistor 306 are also connected to the low voltage supply line 18 via a bias transistor 302. The gate of the bias transistor 302 is connected to receive a bias input 301. The effect of the error amplifier 106 is to compare the monitor voltage from point 164 to the high reference signal 112.

Figure 4B:
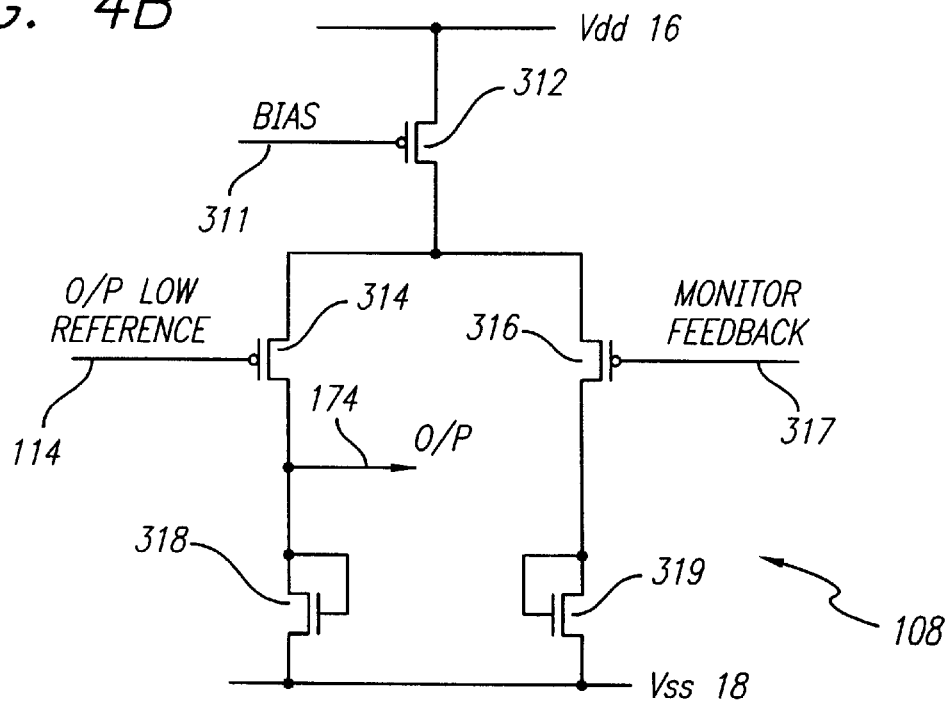

FIG. 4B is an example of an implementation of the second error amplifier 108. The second error amplifier 108 includes first and second N-FETs 318 and 319 connected as current sources to the low voltage supply line Vss 18. The first current source transistor 318 is connected to a P-FET 314, which forms a reference signal input transistor, the gate of which is connected to receive the low reference 114. The junction between the first current source transistor 318 and the reference signal input transistor 314 forms the output control signal line 174. The second current source transistor 319 is connected to a P-FET 316, which forms a monitor signal input transistor, the gate of which is connected to receive the monitor signal 317 (in FIG. 3 fed back from the junction point 166). The reference input transistor 314 and the monitor signal transistor 316 are also connected to the high voltage supply line 16 via a bias transistor 312. The gate of the bias transistor 312 is connected to receive a bias input 311. The effect of the error amplifier 108 is to compare the monitor voltage from point 166 to the low reference signal 114.

Figure 5:
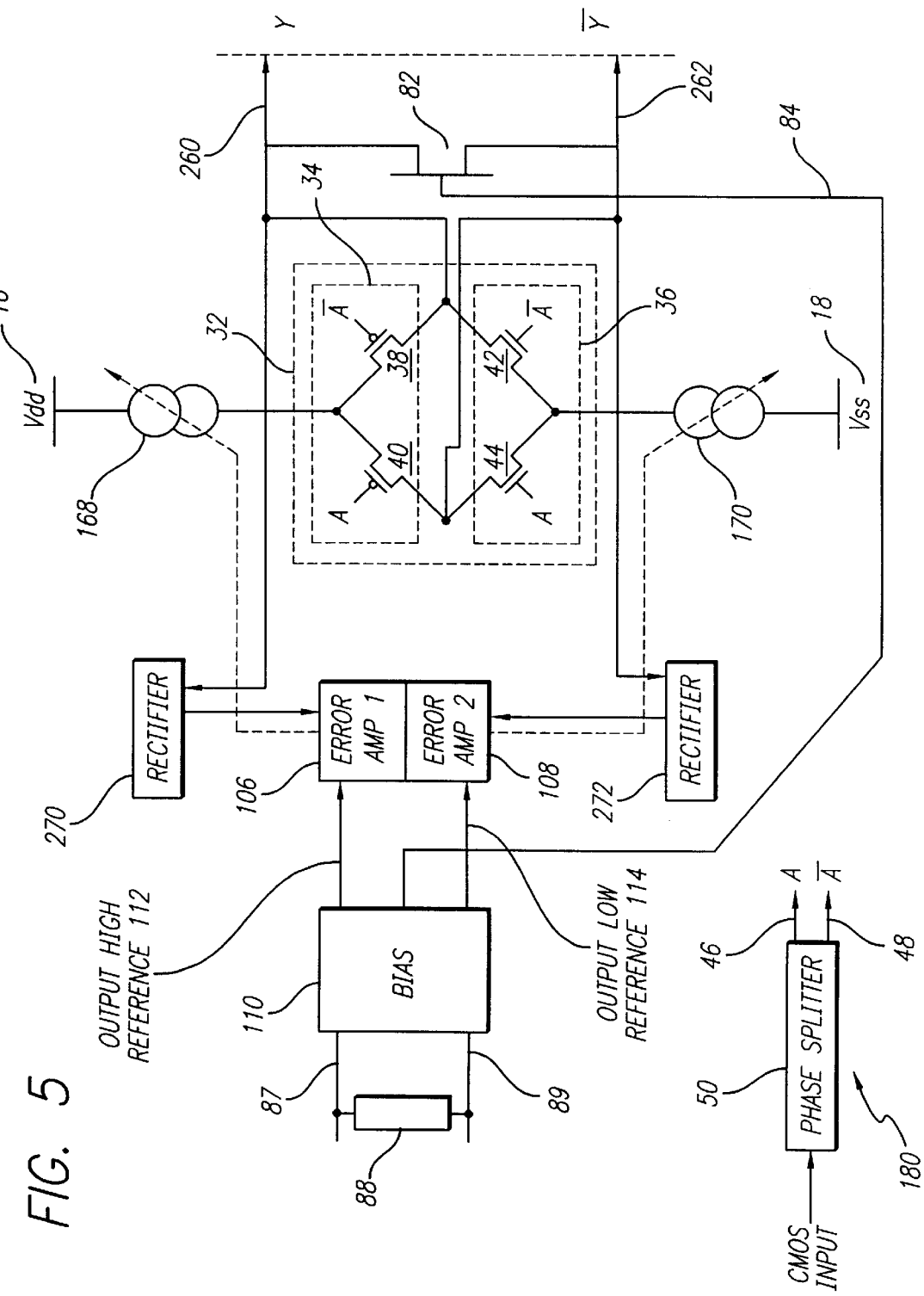
FIG. 5 is a schematic diagram of a third embodiment.

FIG. 5 illustrates a further embodiment 180 of the invention comprising much in common with the embodiment of FIG. 3. Accordingly, only the differences between these embodiments will be described. In the embodiment of FIG. 5, the output voltage levels of the signals Y and $\overline{Y}$ are measured directly rather than the voltages at the junctions 164 and 166 of FIG. 3. However, as the voltages being output on the lines 260 and 262 in FIG. 5 are alternating, the signals are rectified before being input to the error amplifiers 106 and 108.

In particular, a first voltage level detected on the output line 260 is supplied to a first rectifier 270 before the rectified signal is applied to the error amplifier 106. Also, the signal $\overline{Y}$ is monitored on line 262 and is supplied to a rectifier 272 from which a negative rectified signal is applied to the error amplifier 108.

As the driven output signals are measured directly, it is not necessary to adjust the output high reference 112 and output low reference 114 to compensate for the offset described with reference to FIG. 3.

It will be appreciated that in FIG. 5 embodiment, as in the FIG. 3 embodiment, it is possible to control a respective active output impedance device by means of the common bias circuit 110, thus enabling the use of the single precision resistor 88 as the impedance reference.

Figure 6:
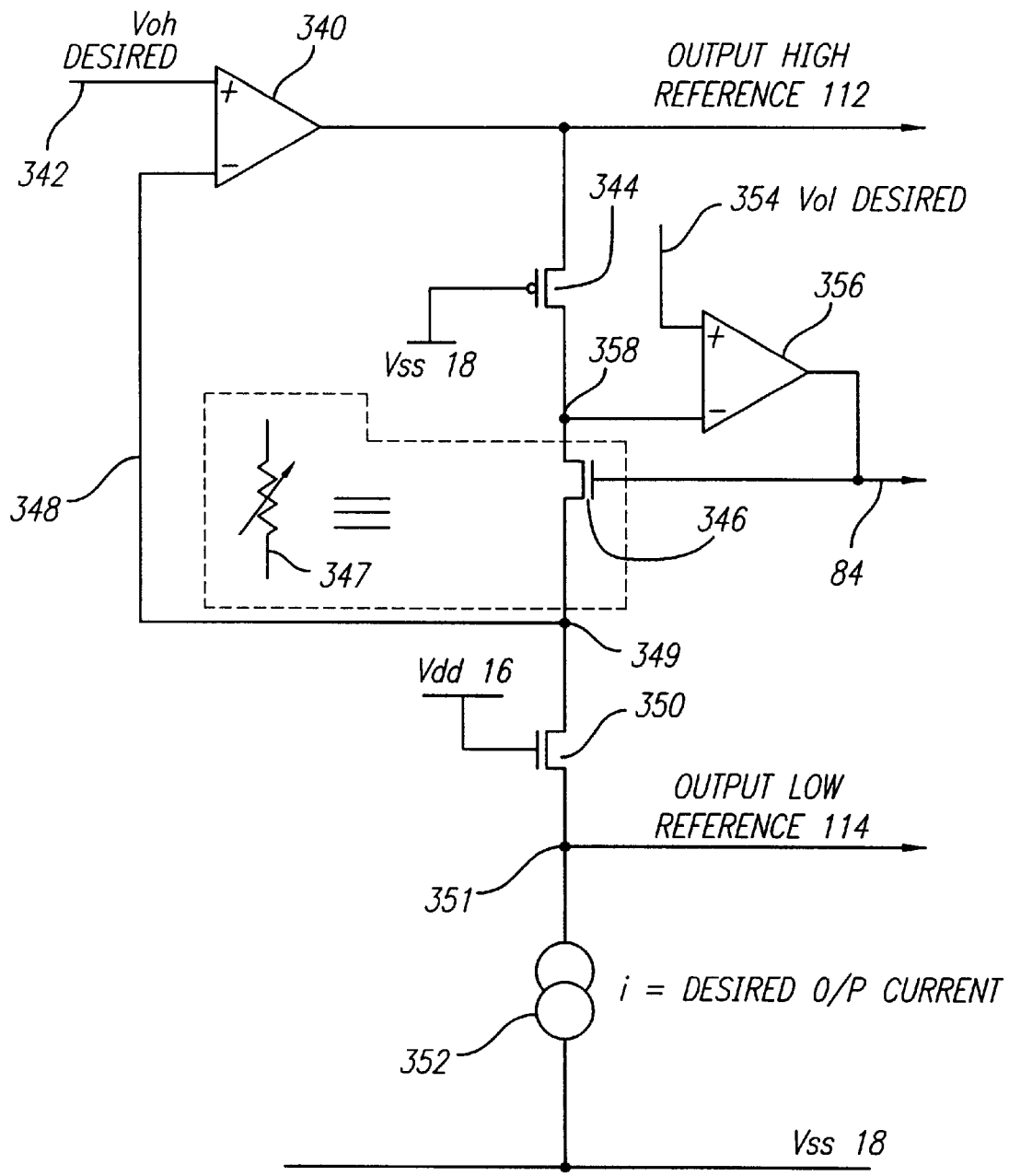
FIG. 6 illustrates an example of a bias circuit.

FIG. 6 is an example of a circuit for implementing the bias circuit 86 of FIG. 2 based on the use of an active device which is suitable for impedance matching once the voltage levels at the output are known and stable. In this circuit, a desired high voltage level Voh 342 is input to an operational amplifier 340, the output of which is connected to form the output high reference signal 112. The output of the operational amplifier 340 is also connected to a PMOS transistor 344. The gate of the transistor 344 is connected to the low voltage supply line 18. The transistor 344 is also connected to an active variable impedance device 346, here configured as an NMOS transistor 346. The transistor 346 effectively implements a variable resistor represented schematically at 347. The gate of the transistor 346 is connected to the control line 84 for controlling the active impedance element 82. The junction 358 between the transistor 344 and the transistor 346 is connected to one input of an operational amplifier 356. The other input of the operational amplifier is connected to receive a desired low voltage signal Vol 354. The output of the operational amplifier 356 is connected to the control line 84.

The transistor 346 is also connected to another NMOS transistor 350. The junction 349 between the transistors 346 and 350 is connected to a second input of the operational amplifier 340. The gate of the transistor 350 is connected to the high voltage supply line Vdd. The transistor 350 is further connected via a constant current source 352 to the low voltage supply line Vss 18. The constant current source 352 is arranged to supply a desired output current i. The junction 351 between the transistor 350 and the constant current source 352 is connected to the output low reference line 114. In the example of FIG. 6, there is no reference resistor corresponding to the reference resistor 88 shown in FIGS. 2 and 3. Thus the "reference resistance" is simulated, or implied, by the use of a reference voltage and a reference current. The active "implied" resistance is applied between nodes 349 and 358.

Figure 7:
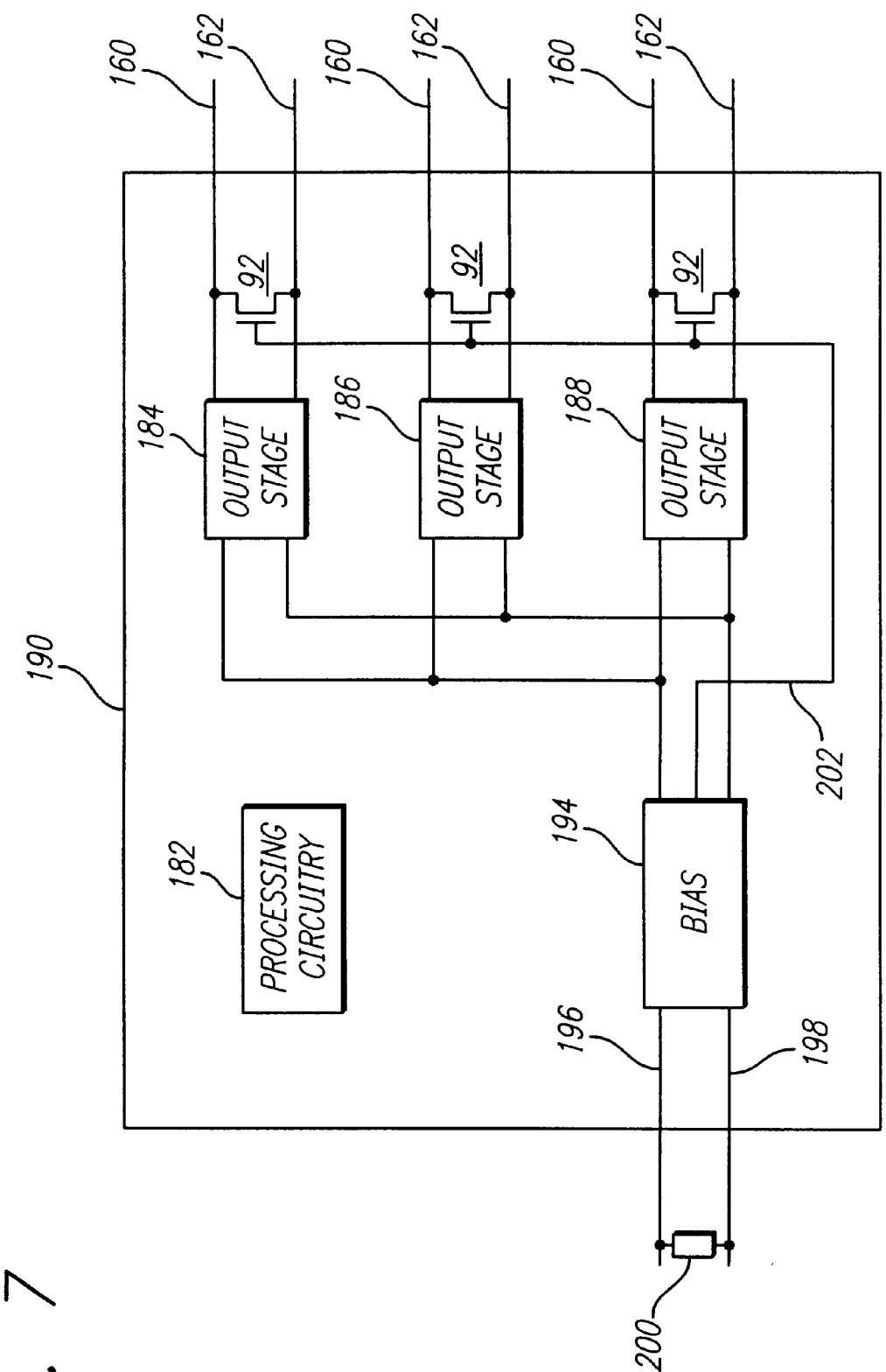
FIG. 7 is a schematic representation of an integrated circuit including a differential output circuit in accordance with the invention.

FIG. 7 is a schematic representation of an integrated circuit including output driver circuits in accordance with FIG. 2. It will be noted that the integrated circuit 190 is shown to comprise internal processing circuitry 182, which may take whatever form is appropriate for a specific application of the invention and a plurality of (here three) differential mode output driver stages 184. 186, 188, each having first and second outputs 160 and 162. As shown schematically in FIG. 7, each output driver stage is associated with a respective on-chip active impedance element (MOSFET) 92. A single bias circuit 194 is provided with first and second inputs 196, 198 across which a single external precision reference resistor 200 is attached. An impedance control signal is supplied from the bias circuit 194 via line 202 to each of the active impedance elements 92 for controlling the impedance value of that element.

It will be appreciated that other embodiments of an integrated circuit could be based on different implementations of the driver circuits. Also, other numbers of driver stages (1, 2 or more, even significantly more than 3 driver stages) can be provided in an integrated circuit.

Accordingly, it will be appreciated that although particular embodiments of the invention have been described, many modifications and or additions may be made within the spirit and scope of the invention. For example, although in the above embodiments of the invention P and N type MOSFET devices have been described for certain components, different device types and circuit technologies may be used in other embodiments.

What is claimed is:
1. A differential output circuit comprising:
   a first output line;
   a second output line;
   an output impedance connected between said first and second lines, wherein said output impedance comprises an active device including a control input for receiving a control signal value for controlling the impedance value of said active device;

a bias circuit responsive to a voltage across a reference impedance element for generating said control signal value for controlling the impedance value of said active device; and an output driver stage connected to said first and second output lines for supplying first and second differential driven output signals to said first and second output lines, respectively;

wherein said output driver stage is connected to receive reference signal levels from said bias circuit.

2. A differential output circuit according to claim 1, wherein said active device is a transistor.

3. A differential output circuit according to claim 2, wherein said transistor is a field effect transistor.

4. An integrated circuit comprising:

a plurality of differential output circuits, each said differential output circuit having a pair of first and second output lines and an output impedance connected between said first and second output lines, wherein said output impedance comprises an active device including a control input for receiving a control signal value for controlling the impedance value of said active device;

a common bias circuit responsive to a voltage across a reference impedance element for generating said control signal value for controlling the impedance value of each said active device; and first and second inputs for connection to the reference impedance element, wherein said reference impedance element is external and outside of said integrated circuit.

5. An integrated circuit comprising:

a differential output circuit, said differential output circuit having first and second output lines and an output impedance connected between said first and second output lines, wherein said output impedance comprises an active device including a control input for receiving a control signal value for controlling the impedance value of said active device;

a common bias circuit operatively connected to a reference impedance element for generating said control signal value for controlling the impedance value of said active device;

an output driver stage connected to said first and second output lines; and first and second inputs for connection to the reference impedance element, wherein said reference impedance element is external and outside of said integrated circuit.

6. A differential output circuit according to claim 4, wherein said active device is a transistor.

7. A differential output circuit according to claim 6, wherein said transistor is a field effect transistor.

8. An integrated circuit according to claim 5, wherein each said active device is a transistor.

9. An integrated circuit according to claim 8, wherein said transistor is a filed effect transistor.

10. A differential output circuit comprising:

a first output line;

a second output line;

an output impedance connected between said first and second lines, wherein said output impedance comprises an active device including a control input for receiving a control signal value for controlling the impedance value of said active device;

a bias circuit responsive to a voltage across a reference impedance element for generating said control signal value for controlling the impedance value of said active device; and an output driver stage connected to said first and second output lines for supplying first and second differential driven output signals to said first and second output lines, respectively; and a feedback path from the first and second output lines for controlling supply voltages to the output driver stage.

* * * * *